(12) United States Patent
Anzou et al.

(10) Patent No.: US 7,228,262 B2
(45) Date of Patent: Jun. 5, 2007

(54) SEMICONDUCTOR INTEGRATED CIRCUIT VERIFICATION SYSTEM

(75) Inventors: Kenichi Anzou, Kawasaki (JP);
Chikako Tokunaga, Yokohama (JP);
Takashi Matsumoto, Chiba (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 341 days.

(21) Appl. No.: 10/884,251

(22) Filed: Jul. 1, 2004

(65) Prior Publication Data

US 2005/0015693 A1 Jan. 20, 2005

(30) Foreign Application Priority Data

Jul. 15, 2003 (JP) ............................ P2003-197112

(51) Int. Cl.
*G06F 17/50* (2006.01)
(52) U.S. Cl. ............... 703/14; 716/1; 716/8; 716/11;
716/4; 716/5; 716/6; 716/10; 703/15; 703/19;
703/17; 714/36; 714/30; 714/31; 702/66;
702/70; 702/74
(58) Field of Classification Search ............... 714/742,
714/724, 736; 716/4, 5, 11, 1; 703/14
See application file for complete search history.

(56) References Cited

U.S. PATENT DOCUMENTS

| | | | | |
|---|---|---|---|---|
| 5,220,512 A | * | 6/1993 | Watkins et al. | 716/11 |
| 5,535,223 A | * | 7/1996 | Horstmann et al. | 714/744 |
| 5,862,149 A | * | 1/1999 | Carpenter et al. | 714/726 |
| 6,059,451 A | * | 5/2000 | Scott et al. | 714/726 |
| 6,067,650 A | * | 5/2000 | Beausang et al. | 714/726 |
| 6,170,072 B1 | | 1/2001 | Moriguchi et al. | |
| 6,449,755 B1 | * | 9/2002 | Beausang et al. | 716/5 |
| 6,678,871 B2 | * | 1/2004 | Takeyama et al. | 716/6 |
| 6,701,504 B2 | * | 3/2004 | Chang et al. | 716/10 |
| 6,988,232 B2 | * | 1/2006 | Ricchetti et al. | 714/736 |
| 2002/0073380 A1 | * | 6/2002 | Cooke et al. | 716/1 |
| 2002/0166098 A1 | * | 11/2002 | Chang et al. | 716/1 |

(Continued)

OTHER PUBLICATIONS

Wolfgang Meyer, Raul Camposano□□Fast Hierachical Multi-Level Fault Simulation of Sequential Circuits with Switch-Level Accuracy□□30 ACM/IEEE Design Automation Conference, 1993 ACM 0-89791-577-1/93/0006-0515.*

(Continued)

*Primary Examiner*—Kamini Shah
*Assistant Examiner*—Cuong Van Luu
(74) *Attorney, Agent, or Firm*—DLA Piper US LLP

(57) ABSTRACT

An aspect of the present invention provides a semiconductor integrated circuit verification system that includes a compiler configured to receive circuit descriptions of a semiconductor integrated circuit to be verified and create a circuit database, a circuit analysis unit configured to receive the circuit database to analyze the circuitry inside the semiconductor integrated circuit based on the circuit database, the circuit analysis unit configured to determine the timing at which the abstraction level of the circuit is switched and generate a simulation object, and a simulation execution unit configured to receive the simulation object and conduct a simulation of the semiconductor integrated circuit based on the simulation object.

19 Claims, 11 Drawing Sheets

U.S. PATENT DOCUMENTS

| | | | |
|---|---|---|---|
| 2003/0009727 A1* | 1/2003 | Takeyama et al. | 716/1 |
| 2003/0023941 A1* | 1/2003 | Wang et al. | 716/4 |
| 2003/0149949 A1* | 8/2003 | Price et al. | 716/4 |
| 2004/0148150 A1* | 7/2004 | Ashar et al. | 703/14 |
| 2005/0015691 A1* | 1/2005 | Nozuyama | 714/724 |
| 2005/0229123 A1* | 10/2005 | Wang et al. | 716/4 |
| 2006/0107160 A1* | 5/2006 | Ricchetti et al. | 714/742 |

OTHER PUBLICATIONS

Robert Chen, James Coffman☐☐Multi-Sim, A Dynamic Multi-Level Simulator☐☐Proceedings of the 15th Conference on Design Automation, Jun. 1978.*

* cited by examiner (PRIOR ART) FIG. 9
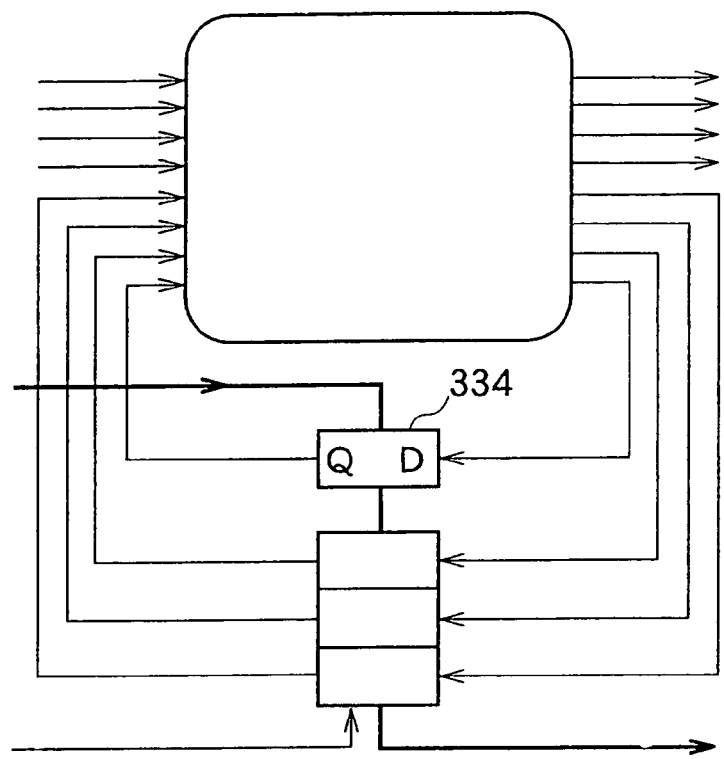
(PRIOR ART) FIG. 10
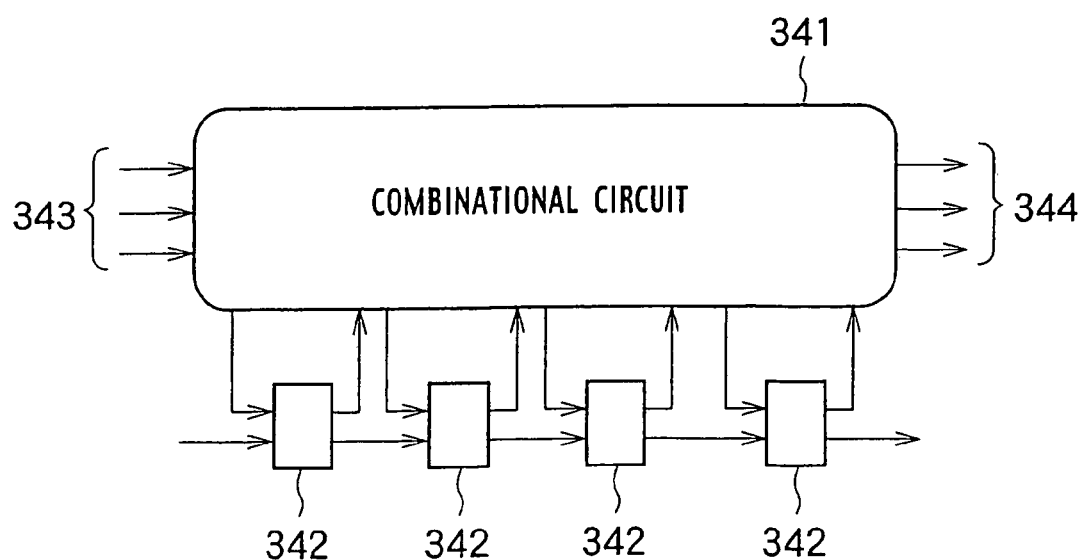

(PRIOR ART) FIG. 11
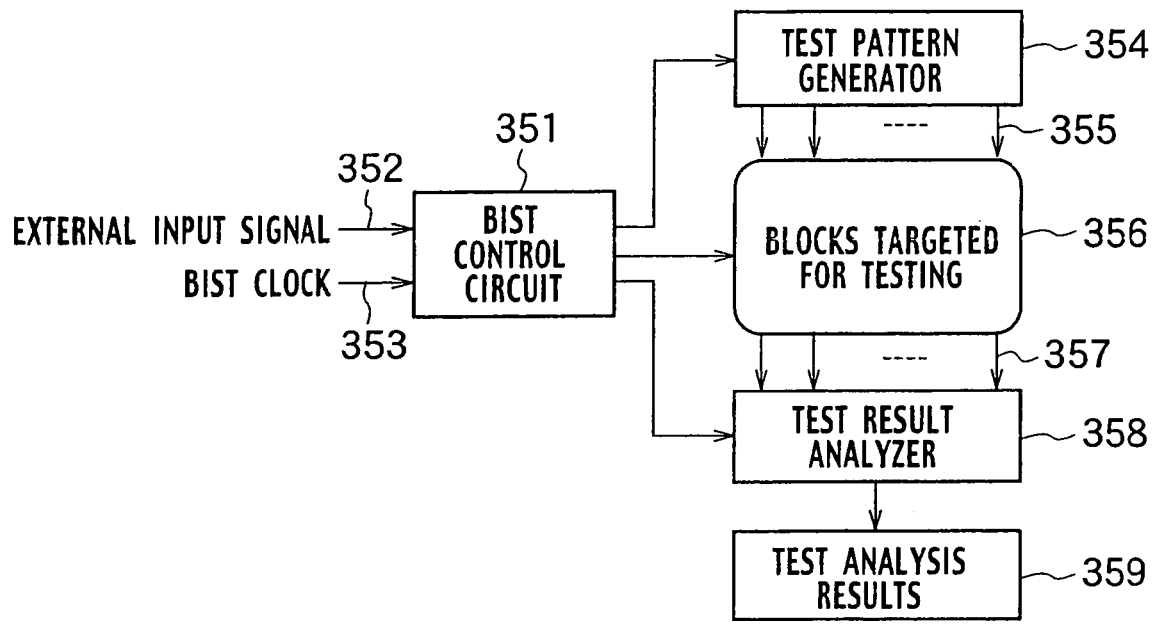
(PRIOR ART) FIG. 12
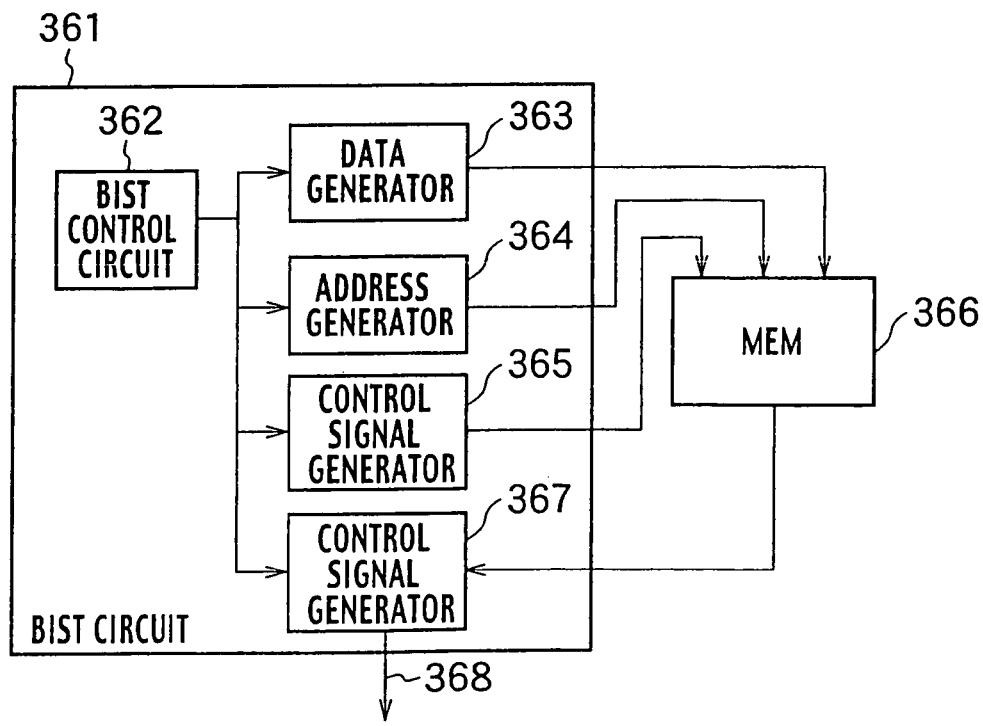

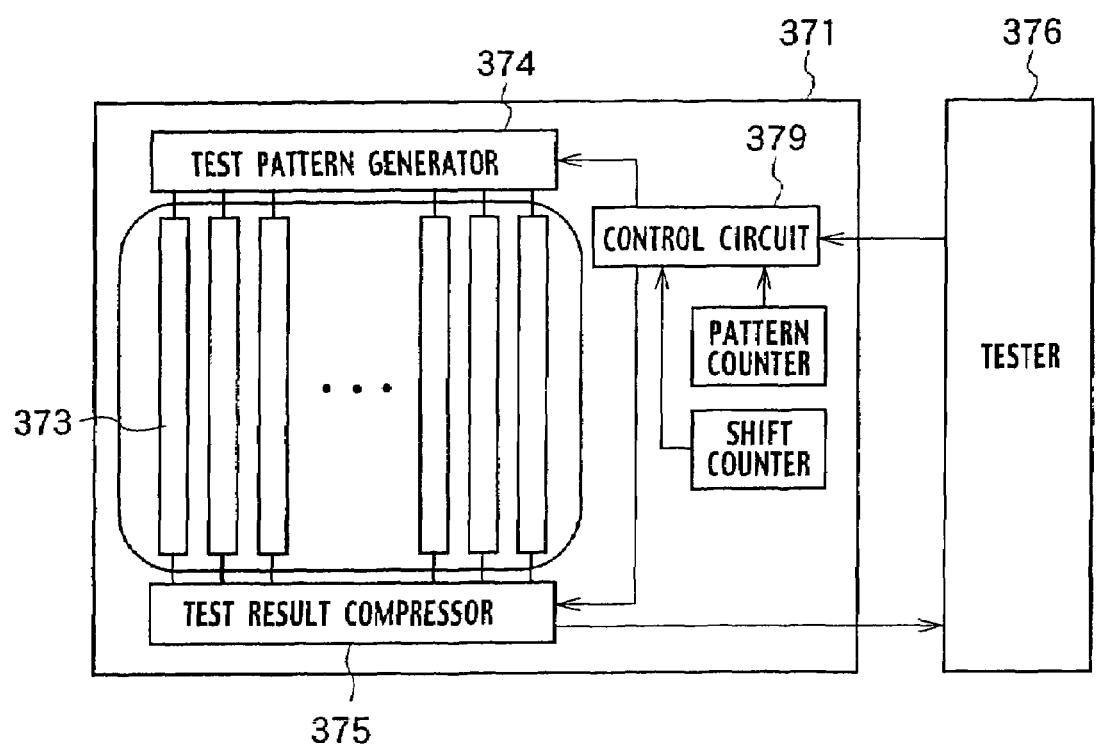
(PRIOR ART) FIG. 13

SEMICONDUCTOR INTEGRATED CIRCUIT VERIFICATION SYSTEM

CROSS REFERENCE TO RELATED APPLICATIONS

This application is based upon and claims the benefit of priority from the prior Japanese Patent Application No. P2003-197112 filed on Jul. 15, 2003, the entire contents of which are incorporated herein by reference.

BACKGROUND OF THE INVENTION

1. Field of the Invention

The present invention relates to a system for verifying semiconductor integrated circuits, more particularly, to a verification system that includes simulation of semiconductor integrated circuits.

2. Description of Related Art

The work of creating test patterns for testing large-scale and complex LSI circuits makes up a large portion of the time required for designing LSI devices. Sometimes test patterns created for design function verification are selected in a combination that yields high fault coverage and used for manufacturing testing, but the problem with this approach is that the quality of the selected test patterns often does not yield a fault coverage that is believed to be sufficient for the manufacturing test. Test patterns for function verification are created based on the criterion that each function within the design is being executed correctly, but this is different than the criterion that faults in the circuitry are detected. In the case of large-scale circuits, since a tremendous amount of time would be required to execute fault simulations in order to find the fault coverage, test patterns are selected by conducting fault simulations that involve sampling faults and by selecting based on the activation rates of signals found in logic simulations. These methods do not enable the fault coverage to be found accurately.

Design for testability (DFT) is a technology in which test circuits that are as small-scale as possible are added to an LSI circuit in order to increase the ease with which the LSI circuit can be tested and optimize the test pattern creation time, test pattern size, testing time, and final fault coverage. Representative examples of DFT technologies include scan design, memory BIST, and logic BIST.

Scan design is a DFT technology that has been used widely in this area. As shown in FIG. 9, all of the registers 334 (flip flops or latches) inside a sequential circuit are converted to special registers called scan registers and connected serially as at least one shift register (scan path). Use of this structure enables the normally difficult task of controlling and observing the internal registers of the circuit to be accomplished directly by using external input and output terminals. As a result, the work of creating test patterns is greatly simplified. In particular, by using a program to conduct automatic test pattern generation (ATPG), test patterns having high fault coverage can be created in a short amount of time.

There are several design rules which must be obeyed when using ATPG to automatically generate test patterns for a scan-designed circuit. If portions that are not in accordance with these rules remain in the circuit, the possibility will exist that the generated test patterns are not correct. Additionally, in many cases, the ATPG tool handles the circuit as a completely synchronized circuit and generates the patterns based on the assumption that the clock is applied to all registers simultaneously. Consequently, it is feasible that the actual circuit will not operate correctly in cases where clock skewing has occurred. Because of these issues, it is sometimes necessary to simulate the generated test patterns and verify that they are correct.

The scan test patterns are made up chiefly of shift cycles during which test data is sent to and received from the scan path and cycles during which the logic circuit executes system operations. The latter are made up of external input settings, system clock input, and external output monitoring and can be executed with one cycle. The logic simulation, of course, involves simulating all of these operations.

The problem is the time required for the shift cycle. During shift operations, the output of the scan register changes randomly and the resulting events propagate to the inside of the logic circuit. In many cases it is not actually necessary to simulate these operations. For example, in the case of a full scan circuit, it is the signal value set in the register at the point in time when the shift is completed that is important and, thus, operations taking place during the shift are totally unrelated to the test. However, it is actually this shift operation portion that requires the most time for simulation.

A technique called parallel load simulation is used to curtail this kind of unnecessary simulation time. In parallel load simulation, instead of simulating the shift cycle, the scan in pattern is assigned directly to the register and the register values are observed directly. There are various methods of direct assignment, including assigning the scan in pattern to the output signal of the register and assigning the scan in pattern to the scan input and applying the scan clock once only.

FIG. 10 is an example circuit for explaining the parallel load simulation technique. This simulation is as follows. (1) A test pattern is assigned directly to a register 342 connected to a combinational circuit 341. (2) An input pattern is fed to an external input 343. (3) An external output 344 is checked after a prescribed amount of time and, then, a system clock is applied to the register in a normal mode and the test results are captured. (4) The values of the register 342 are observed directly and compared with expected values. These operations are all executed with respect to all patterns. If necessary, the test mode is selected when setting and observing values of the register.

The parallel load simulation technology greatly reduces the verification simulation time of the scan test patterns. However, there are still problems in comparison with a simple simulation, e.g., the fact that the shift operation portion is not simulated and necessity to create test patterns for PLS from scan test patterns.

One widely used testability technique for resolving the difficulty of testing large-scale, complex semiconductor integrated circuits is BIST (built-in self test). BIST involves both generating test patterns to be applied to blocks targeted for testing and analyzing the test result output from the blocks targeted for testing in a fully automatic fashion using a logic circuit provided in the periphery of the targeted test blocks.

FIG. 11 shows a general configuration for BIST. The external input signal 352 for the test mode setting is used to set the semiconductor integrated circuit, including a block 356 targeted for testing, to test mode. In test mode, the input and output of the block targeted for testing are connected to input and output signals for testing that are different than during normal operation. After the BIST circuit is initialized, the self test is executed by setting the BIST clock 353 in a pre-defined times. The test mode signal and the BIST clock are fed directly from an external input signal or through a BIST control circuit 351. While the self test is being executed, the input 355 to the block 356 targeted for testing is generated automatically by a test pattern generator 354 and the test patterns are fed to the block 356 targeted for testing through the test pattern output 355. The test result output 357 from the block targeted for testing is fed to a test result analyzer 358 where it is compared with expected values in a consecutive fashion or converted into compressed data (signature) of a prescribed bit length. Finally, the test analysis results 359 for the block 356 targeted for testing are outputted and a determination is made as to whether the test results are good or bad.

With BIST, it is not necessary to prepare test patterns stored in an external test memory and the cost of the tester is curtailed. Since all operations are executed within the device in synchronization with the BIST clock, it is possible to conduct tests at a higher operating speed than the test operating frequency of the tester by setting the BIST clock so as to achieve a high operating speed. Consequently, product testing can be conducted at a speed that is close to actual operation. Since a small number of external input and output signals for testing are all that is required to perform BIST, a plurality of blocks can be tested in a parallel manner. This can greatly curtail the total test time.

Depending on the type of block targeting for testing, BIST can be divided into memory BIST performed with respect to memory devices and logic BIST performed with respect to logic blocks. With respect to memory devices, the input pattern generator generates algorithm-like regular patterns because of the structure and operational regularity of memory devices. Conversely, with respect to logic blocks, a pseudo-random pattern generator (PRPG) is used because the operation of logic blocks is generally random. A linear feedback shift register (LFSR) is often used as the random pattern generator because of the simplicity of its structure.

BIST technology is currently used widely with respect to memory. The BIST circuit sequentially and automatically generates data input, address input, and a control signal for making the memory perform read and write operations and feeds these signals to the memory inputs. Analysis as to whether or not the memory output is correct when the memory performs the read operation is executed within the BIST circuit. Examples of the method of analysis include the comparator method, whereby the readout data are compared to expected values generated sequentially inside the BIST circuit, and the compressor method, whereby the data are sequentially compressed and the final compression results are compared to pre-calculated expected values.

FIG. 12 illustrates the configuration of a general memory BIST circuit. The BIST control circuit 362 inside the BIST circuit 361 sequentially generates signals required for controlling the data generator 363, the address generator 364, and the control signal generator 365. The generated signals are fed to the inputs of the memory 366. The memory output is fed to the result analyzer 367 and a determination as to whether the memory is good or bad is provided as a test result determination signal 368.

The testing executed by the BIST circuit is performed in the following order: initialization of BIST circuit, execution of BIST, determination of BIST results. Since the test is advance by merely applying a clock signal from the outside, BIST can be conducted without executing complex control operations. This feature gives BIST circuits the advantage of being easy to use in parallel testing conducted in parallel with another test circuit.

When a memory BIST circuit is inserted in the design, a simulation is conducted for verification of the BIST circuit. The simulation execution time depends on the size of the memory and often becomes very long in the case of large-scale memories, such as DRAMs. In the case of memory BIST, it is chiefly the BIST circuit, the memory targeted for BIST, and the peripheral circuitry controlling the testing that require verification. If the clock input for the BIST or the memory is propagating to other user logic circuits, that circuit portion will operate during execution of the BIST test and cause extra simulation time to be required. In the case of large-scale LSI, in which the logic portion is large, the increase in simulation is sometimes quite significant. One method of avoiding this situation is to add a circuit that suppresses propagation of the clock signal to other logics during execution of the BIST, but this involves adding a circuit that is not actually necessary and presents the possibility of making the clock design more complex. Another method is to create netlist for a BIST simulation from which the logic portions that do not require simulation have been deleted. With this method, although simulation of unnecessary circuit portions is avoided, a separate netlist must be created for simulation. Furthermore, when simulation with delay is performed, errors sometimes occur when the system attempts to assign delays to the circuit portions that have been deleted from the delay information file, resulting in a large amount of message output.

There are several methods of logic BIST but the most popular in recent years is Self-Testing Using MISR and Parallel SRSGs (STUMPS). SRSG stands for Shift Register Sequence Generator and is synonymous with the previously mentioned PRPG (Pseudo-Random Pattern Generator). STUMPS is one of the logic BIST techniques called "serial BIST." In serial BIST, the application of the test patterns from the pattern generator and the capturing of the test results inside the pattern compressor are conducted using serial access. One of the advantages of serial BIST is that the scan design inside the logic circuit can be used as is. In other words, if the circuit is already scan designed, the increase in circuit size caused by BIST will be comparatively small and there will be no additional degradation in performance.

FIG. 13 is a schematic view of the STUMPS structure. A portion or all of the registers inside the logic circuit 371 targeted for testing are replaced by scan registers and are made up of scan paths 373. The input and output of the logic circuit 371 targeted for testing must be controlled and observed during the testing and this is accomplished by inserting scan registers and composing shift registers. The shift registers are normally configured to share a boundary scan circuit that is in compliance with IEEE 1149.1. The logic BIST circuit is made up of a pattern generator 374, a test result compressor 375, etc. The control of all of the test circuits and the supply of the scan shift clock are conducted through a logic BIST control circuit 379.

A test conducted using the STUMPS structure shown in FIG. 13 is conducted according to the following procedure. First, initial values that will serve as seed values for generating pseudo-random numbers are set into the pattern generator. It is acceptable that the initial values are not-all "0" values that has at least one "1" bit in the values. The test pattern generator 374 begins generating pseudo-random patterns at the next clock cycle. The generated patterns are fed sequentially to the scan paths 373 inside the logic circuit 371 targeted for testing. Once a pattern has been set into all of the scan paths 373 inside the logic circuit 371 targeted for testing, the value of the controllable input (external input and scan register) of the logic circuit 371 targeted for testing is thereby determined. At this point, the system clock is inputted once and values are captured in a register on the output side. Next, the scan paths 373 inside the logic circuit 371 targeted for testing are shifted and the test results are compressed while sequentially capturing the values in the test result compressor 375. This completes one application of a test pattern to the logic circuit 371 targeted for testing. This operation is repeated for each test pattern and the final value in the compressor is used as a signature and compared to the expected value to determine if the circuit is good or bad. The shift of the test result to the compressor and the input of the next pattern normally occur simultaneously. The number of scan paths is arbitrary but the larger the number of scan paths is, the shorter the shift time is and the more the time required for applying the test patterns can be reduced. Since the time required for shifting in a pattern depends on the length of the longest scan path, the use of a large number of scan paths is more effective if the path lengths are uniform.

After a logic BIST circuit has been mounted inside the design, it is necessary to conduct a simulation for verification. Since full scan design is standard for STUMPS circuits, it is futile to conduct a simulation related to the operation of the logic circuit portion during scan shifting as is done in the case of scan design. If a parallel load simulation is conducted with respect to a logic BIST circuit in the same manner as in the case of scan design, the following problems will occur. Firstly, since the input patterns to be scan shifted are generated automatically by the pseudo-random pattern generator inside the LSI, the input patterns cannot be known based on the patterns applied from the outside. Additionally, although the patterns to be shifted out are obtained when the shift clock is applied and the output of the combinational circuit portion is captured in the scan register, in the case of STUMPS these patterns are inputted to the compressor and only the compressed result can be known based on the patterns applied from the outside.

The following procedure is required to conduct parallel load simulation under these conditions. (1) Calculate the patterns to be assigned to the scan paths based on the structure of the pseudo-random pattern generator. (2) Assign the patterns directly to the scan register and, after the clock input, monitor the output of the scan register directly. (3) Calculate the compression results for the case of shift output based on the observed register output. (4) Compare the final compression result to the expected compression value outputted from the tool. The only portion of this procedure that is the same as parallel load simulation for scan design is step (2). The problems are that additional processing is required in comparison with simple simulation described previously and that the pattern generator, compressor, and scan shift portions are not simulated. Regarding the latter problem, the operation of said portions must be verified using a separate method.

SUMMARY OF THE INVENTION

An aspect of the present invention provides a semiconductor integrated circuit verification system that includes a compiler configured to receive circuit descriptions of a semiconductor integrated circuit to be verified and create a circuit database, a circuit analysis unit configured to receive the circuit database to analyze the circuitry inside the semiconductor integrated circuit based on the circuit database, the circuit analysis unit configured to determine the timing at which the abstraction level of the circuit is switched and generate a simulation object, and a simulation execution unit configured to receive the simulation object and conduct a simulation of the semiconductor integrated circuit based on the simulation object.

Another aspect of the present invention provides a semiconductor integrated circuit verification system that includes a DFT information input unit configured to receive DFT information, a circuit extraction unit configured to analyze the circuitry inside the semiconductor integrated circuit and extract the circuits related to the verification, and a simulation control unit configured to generate a simulation object for conducting a simulation while changing the abstraction level of the extracted circuits.

BRIEF DESCRIPTION OF THE DRAWINGS

FIG. 9 illustrates conception of the scan design.

FIG. 10 is an example circuit for explaining the parallel load simulation technique.

FIG. 11 shows a general configuration for BIST.

FIG. 12 illustrates the configuration of a general memory BIST circuit.

FIG. 13 is a schematic view of the STUMPS structure.

DETAILED DESCRIPTION OF THE EMBODIMENTS

Figure 1:
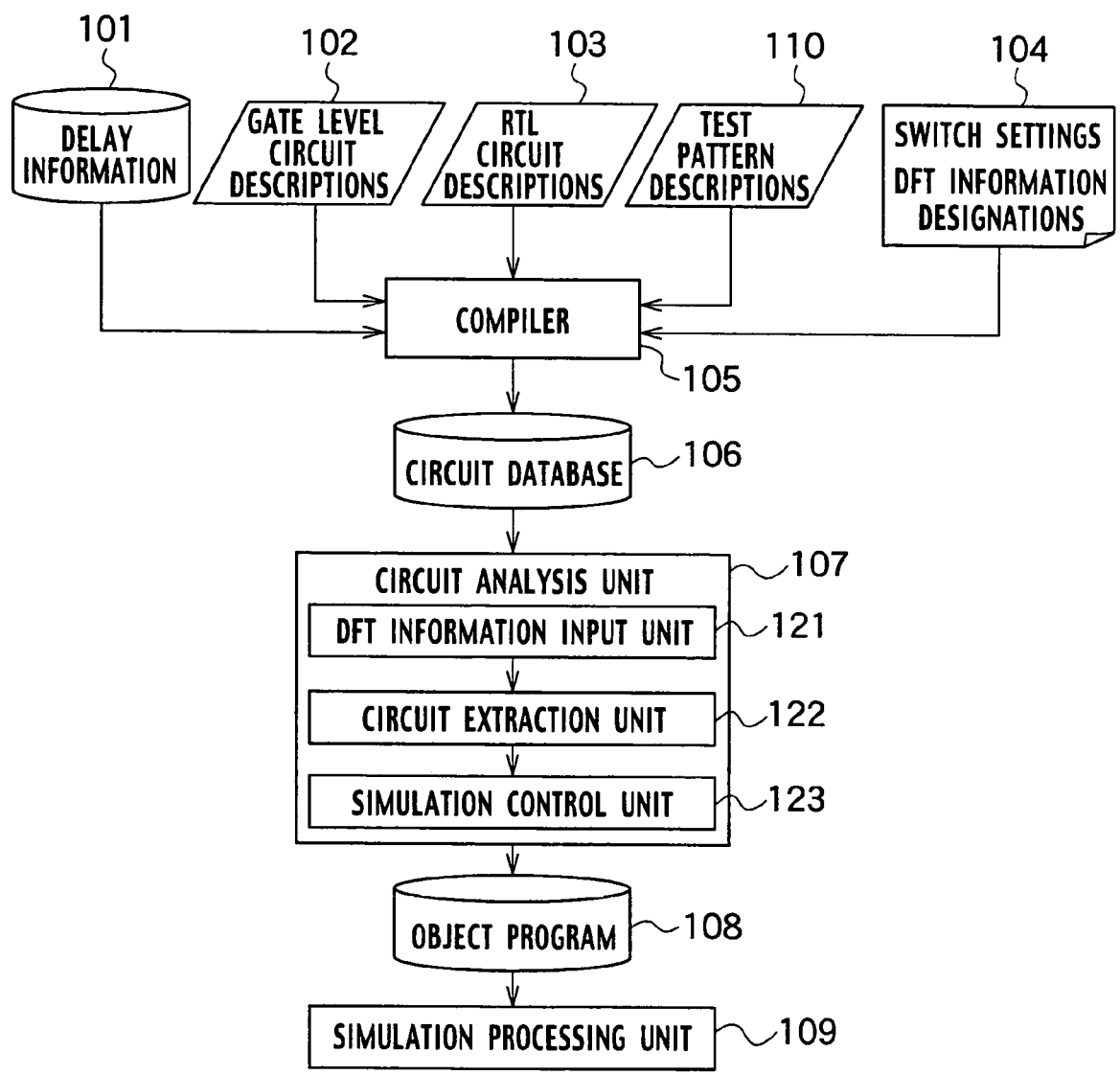
FIG. 1 shows an example configuration of a semiconductor integrated circuit simulation system for realizing a semiconductor integrated circuit verification system in accordance with this embodiment.

Various embodiments of the present invention will be described with reference to the accompanying drawings. It is to be noted that same or similar reference numerals are applied to the same or similar parts and elements throughout the drawings, and the description of the same or similar parts and elements will be omitted or simplified.

As to a hardware configuration of a semiconductor integrated circuit verification according to the embodiment, a computer system may be employed which includes a CPU for executing various processes, input devices such as keyboard, mouse, light pen, flexible disc drive, etc., external memory devices such as memory device, hard disc drive, etc., output devices such as display device, printer, etc. and the like. In addition, the CPU comprises an arithmetic section for executing processes to be described later, and a main memory section for storing instructions for the processes, etc. The computer system includes so-called general-purpose computer, workstation, and Personal computer. Software programmed functions after-mentioned are installed to the computer system to realize verification for semiconductor integrated circuit.

FIG. 1 shows an example configuration of a semiconductor integrated circuit simulation system for realizing a semiconductor integrated circuit verification system in accordance with this embodiment. This semiconductor integrated circuit simulation system includes the following: a compiler 105 that reads in the circuit descriptions of each block of the design and creates a circuit database 106; a circuit analysis unit 107 that reads in the circuit database 106, analyzes the circuits and determines the level switching timing, and outputs a simulation object 108; and a simulation processing unit 109 that receives the simulation object 108 and conducts a simulation based on the simulation object.

With respect to the portions that are simulated while switching among a plurality of circuit levels, the compiler 105 reads in the description at each level. In such cases, the compiler 105 reads in, for instance, the gate level description 102 and the RTL description 103. When a simulation with delay is required, delay information 101 is also read in. Additionally, switch setting DFT information 104 for extracting the DFT circuit can be fed to the compiler 105. This information includes external terminals, internal signals, and block names. Blocks whose levels will be fixed throughout the simulation and conditions settings for switching the simulation level can also be fed to the compiler 105. In this embodiment, the compiler 105 also reads in test pattern descriptions 110. Based on these inputs, the compiler creates the circuit database 106.

Next, the circuit analysis unit 107 analyzes the circuit targeted for testing and generates a simulation object for conducting the simulation. The circuit analysis designates the level of abstraction when a fault simulation is executed or the logic of each block of the semiconductor integrated circuit in accordance with the internal state of the circuit and, during simulation, switches the level of each block according to the state at that point in time. The circuit analysis unit 107 of this embodiment has a DFT information input unit 121 that inputs DFT information, a circuit extraction unit 122 that extracts circuits related to the simulation, and a simulation control unit 123 configured to conduct simulations while switching the circuit descriptions of the extracted circuits.

The circuit analysis unit 107 analyzes the circuit and determines the timing for switching the level based on the information delivered to the compiler 105. The DFT input unit 121 receives relevant DFT information. The DFT information includes various types of information for conducting the verification. The circuit extraction unit 122 then extracts circuit portions that are unnecessary for the simulation from the DFT circuit and the signal information and executes processing, such as setting the extracted portions to the black box level, to minimize the simulation time. Next, the simulation control unit 123 generates a simulation object so as to conduct the simulation while switching the circuit level during the simulation. In order to prevent the functions of the blocks targeted for switching from being different, it is acceptable to execute an equivalence verification processing. It is also acceptable to measure the level switch overhead of each block during the simulation, extract automatically those portions for which the simulation time will be shorter if the level is not switched, and controlling the simulation such that the levels of said portions are not switched.

Thus, as mentioned previously, a simulation object 108 that controls the timing for switching the level is outputted based on the analysis results of the circuit analysis processing unit 107. The simulation processing unit 109 receives the simulation object 108 as input and executes the simulation. The simulation processing unit 109 executes the simulation by switching the simulation level of each circuit portion at prescribed times based on the information stored in the simulation object. Since the level switching involves time overhead, it is also acceptable to conduct the level switching dynamically by measuring the overhead associated with the switching during execution of the simulation and, if there are portions for which the simulation time will be shorter if the level is not switched, thereafter, refraining from executing level switches that involve the same degree of overhead.

In this way, a semiconductor integrated circuit verification system according to this embodiment can reduce unnecessary simulation time and greatly reduce the overall simulation time by switching the level of abstraction of the blocks during execution of the simulation. The level of abstraction of each block includes a behavior level described in such as C language or circuit description language, a RTL (Register Transfer level), and black box level described no connections between devices such as transistor.

First Embodiment

Figure 2:
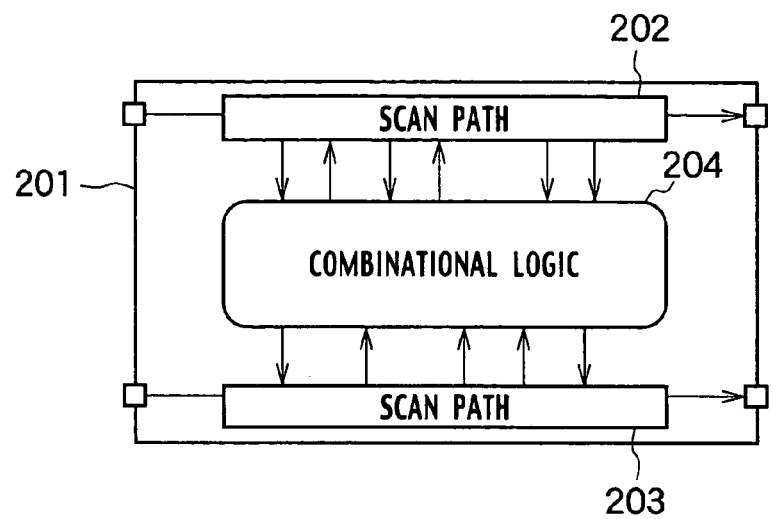
FIG. 2 illustrates the level switching method used during a scan pattern simulation of a scan designed circuit.

FIG. 2 illustrates the level switching method used during a scan pattern simulation of a scan designed circuit. The scan designed circuit 201 has scan paths 202 and 203 and a combinational logic 204 that exchanges data with the scan paths. During the period when the scan paths 202 and 203 are shifted, only the operation of the scan paths need be simulated and it is not necessary to know the operation of the combinational logic 204. Therefore, the scan path portion is simulated with full delay and the combinational logic portion is simulated as a black box. In order to capture the output of the combinational circuit 204 in the scan register, it is necessary to know the output state of the signal that has passed through the combinational circuit from the final shift state. Consequently, the all circuit portions targeted for scan testing are simulated at full delay during the capture operation.

Figure 3:
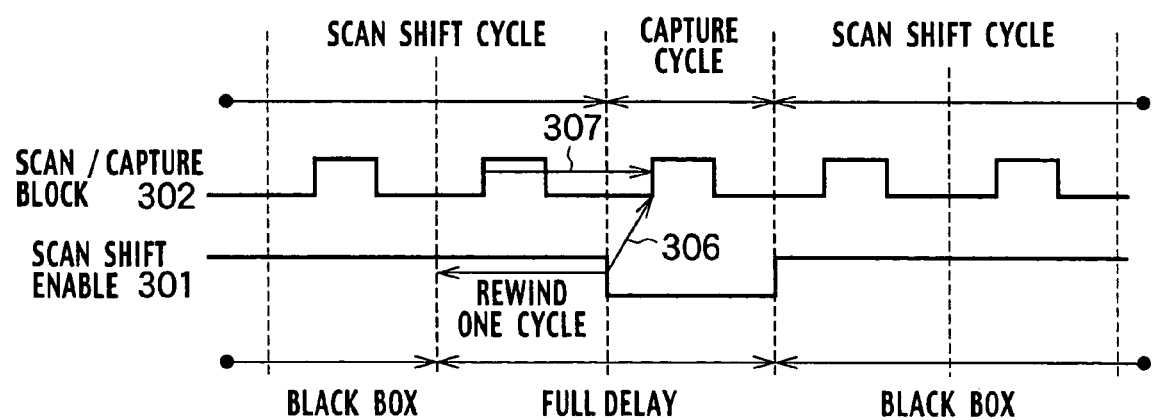
FIG. 3 is a waveform diagram illustrating the shift and capture operations of a so-called single phase scan register, in which the shift clock and capture clock are common.

FIG. 3 is a waveform diagram illustrating the shift and capture operations of a so-called single phase scan register, in which the shift clock and capture clock are common. The method of recognizing the switching time will now be explained using this drawing. Depending on the value of the scan shift enable signal 301, the scan register changes its operating state such that it executes either the shift operation or the capture operation in synchronization with the rising edge of the scan/capture clock 302. In this embodiment, the scan register executes the shift operation when the value of the scan shift enable signal 301 is 1 and the capture operation when the signal value is 0. Thus the scan shift enable signal 301 should be the condition for switching the circuit level, but a problem will occur if the portion targeted for scan testing is merely switched to full delay while the signal value is 0. If the level of the logic circuit was switched to full delay when the scan shift enable signal 301 changed from 1 to 0, the delay would be considered to be the 306 portion. However, in the actual circuit, the actual delay is the 307 portion because the change in the input to the combinational logic circuit is triggered by the clock of the previous cycle. Therefore, in order to reflect this reality, the circuit analysis unit 107 switches to actual delay at a point in time one cycle previous. As a result, the delay verification does not suffer from discrepancies between the simulation and the actual circuit.

The circuit analysis processing executed with respect to the scan design will now be described. In scan design, RTL descriptions are not inputted. Meanwhile, terminal information for scan in, scan out, and scan shift enable is inputted as DFT information. If there are more than one scan chain in the circuit, each type of terminal is designated more than once. If there is a terminal for setting the circuit to scan test mode, that terminal and the signal value thereof during scan testing are designated.

The circuit analysis unit 107 extracts scan circuit. First, when there are designations for test modes, the circuit analysis unit 107 analyzes the circuit while the circuit is in a state in which the test mode signals are inputted thereto and confirms signals whose values become fixed. The circuit analysis unit 107 performs a trace toward the input side at each scan out terminal that has been set. When a scan out terminal of a scan register is reached, that register is cataloged and the trace is continued from the scan input terminal thereof. When the scan input of the circuit is finally reached, the circuit analysis ends. The circuit analysis unit 107 also performs a trace in the direction of the input from the clock input of the scan register and extracts a clock tree structure to the clock signal input. If a device other than the scan register is reached, it is determined if it is possible to execute the trace based on the type and state of the device. If the output of a buffer or inverter is reached, the buffer or inverter is treated as a transparent device and the trace is resumed from the input thereof. Additionally, in the case of an inverter, the circuit analysis unit 107 records that the value of the signal inverts at that point. Meanwhile, if the output of a functional device other than a buffer or inverter is reached and the output of the device can be controlled either directly or in an inverted state based on a single input by looking at the input state of the device, the trace is resumed from the input terminal of the device. In such a case, if the output is in an inverted state, the fact that the value of the signal inverts at that point is recorded in the same manner as for an inverter. If any device other than those described is reached during the trace, an error occurs indicating that the scan chain extraction failed.

If the scan chain trace is successful, the register, buffer, inverter or other device passed through during the extraction and the scan in, scan out, and scan enable terminals are cataloged collectively as a circuit required for the scan shift operation. All other circuit portions are considered to be circuits unnecessary during the scan shift.

The circuit analysis unit 107 also analyzes the test pattern descriptions and extracts the point in time when the signal indicating the disable state will be inputted to the scan enable terminal. The cycles during which the scan disable state exists and the cycle preceding the cycle when the disable state first occurred are deemed to be the period during which simulation of the entire circuit is required and, during this period, simulations at the required level are performed with respect to all portions of the circuit. All other cycles are considered to be scan shift cycles. During these other cycles, simulations at the required level are performed only with respect to circuits that are required for the scan shift operation, i.e., the circuits that were extracted in the previously described processing. The other portions are handled as black boxes and are not operated.

Figure 4:
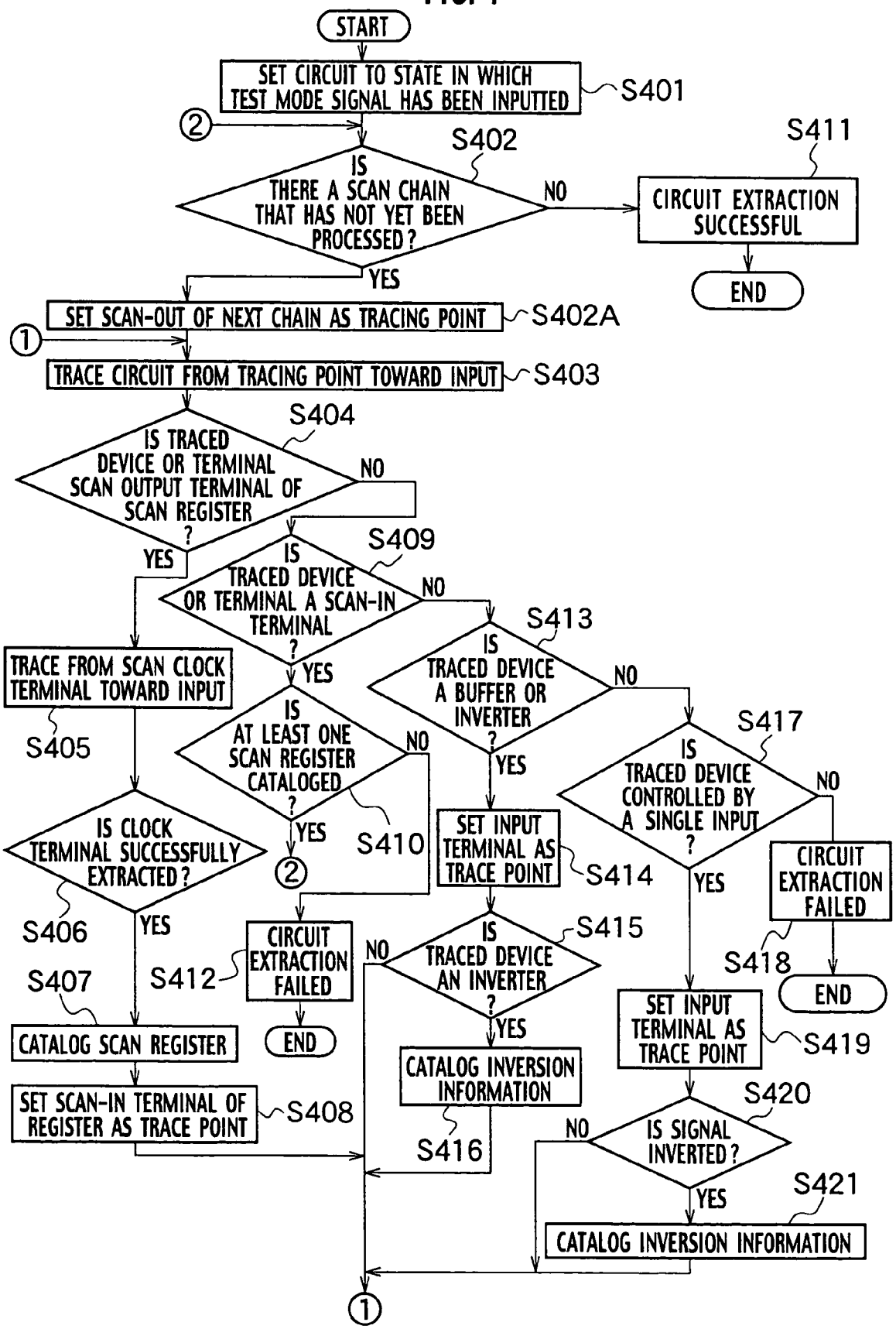
FIG. 4 is a flowchart showing the circuit analysis processing executed with respect to the scan design.

FIG. 4 is a flowchart showing the circuit analysis processing executed with respect to the scan design. Firstly, if there are test mode designations, the circuit is analyzed while in a state of receiving test mode input and signals whose values become fixed are confirmed (step S401). Then, it is determined if there is a scan chain that has not been processed (step S402). If there is a scan chain that has not yet been processed, the scan out of the next chain is set as a trace point (step S402A). Next, the circuit is traced from the set trace point toward input side (step S403).

Next, it is determined if the device or terminal reached by the trace is a scan output terminal of a scan register (step S404) and, if the device or terminal is a scan output terminal of a scan register, the circuit is traced from the scan clock terminal toward input side (step S405). Then, it is determined if the clock terminal has been successfully extracted (step S406). If the extraction was successful, the scan register is cataloged (step S407), the scan in terminal of the register is set as a trace point (step S408), and the analysis processing proceeds to step S403.

Meanwhile, if it is determined in step S404 that the traced device or terminal is not a scan output terminal of a scan register, a determination is made as to whether the traced device or terminal is a scan in terminal of a chain (step S409). If the traced device or terminal is a scan in terminal of a chain, it is determined if one or more scan registers are cataloged (step S410). If one or more scan registers are cataloged, the analysis processing proceeds to step S402. In step S402, if it is determined that all scan chains have been processed, the circuit extraction is deemed successful (step S411) and the processing ends. Meanwhile, if it is determined in step S410 that one or more scan registers has not been cataloged, the circuit extraction is deemed to have failed (step S412) and the processing ends.

If in step S409 it is determined that the traced device or terminal is not a scan in terminal of a chain, a determination is made as to whether the traced device or terminal is a buffer or an inverter (step S413). If the traced device or terminal is a buffer or inverter, the input terminal is set as a trace point (step S414). If the traced device or terminal is an inverter (step S415), the inversion information is cataloged (step S416) and the analysis processing proceeds to step S403. Meanwhile, if it is a buffer, the analysis processing proceeds directly to step S403.

If it is determined in step S413 that the traced device or terminal is neither a buffer nor an inverter, a determination is made as to whether the device or terminal is controlled with a single input (step S417). If the traced device or terminal is not controlled by a single input, the circuit extraction is deemed to have failed (step S418) and the processing ends. Meanwhile, if the traced device or terminal is controlled by a single input, the input terminal thereof is set as a trace point (step S419). Then, a determination is made as to whether the signal is inverted (step S420). If the signal is inverted, the inversion information is cataloged (step S421) and the analysis processing proceeds to step S402. If the signal is not inverted, the analysis processing proceeds directly to step S403.

In this way, the circuits required for the scan operation can be extracted by conducting a circuit analysis with respect to the scan design. As a result, the speed of the simulation for verification of the semiconductor integrated circuit can be increased by setting all other portions to black box status during scan shift.

Second Embodiment

Figure 5:
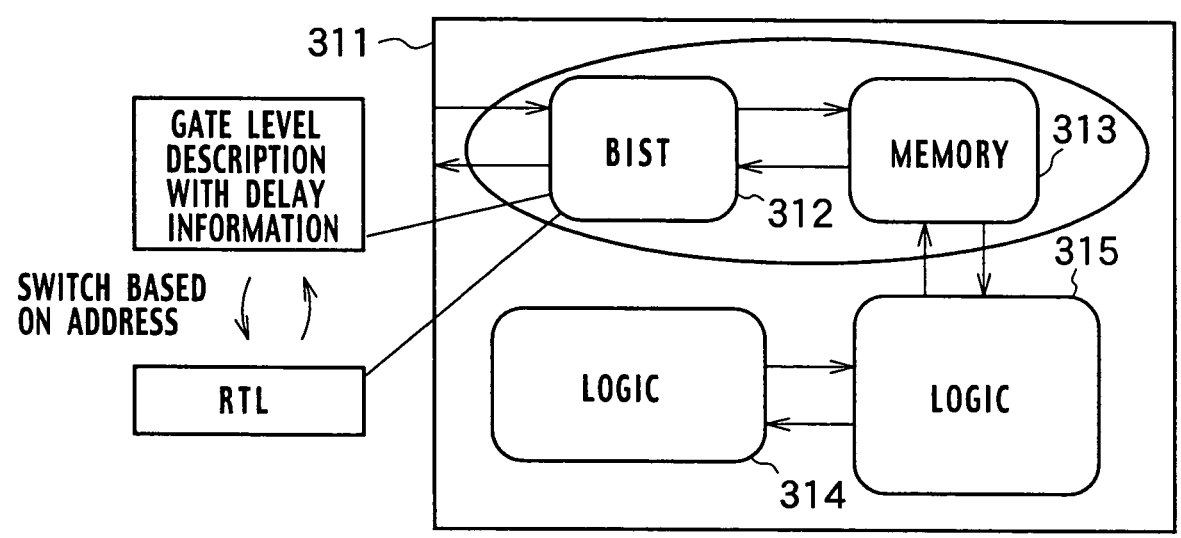
FIG. 5 is a block diagram for explaining the level switching that is performed when a memory BIST circuit is verified.

FIG. 5 is a block diagram for explaining the level switching that is performed when a memory BIST circuit is verified. The targeted circuit 311 has a BIST circuit 312, a memory 313, a logic circuit 314, and a logic circuit 315. The BIST circuit 312 and the memory 313 require verification. Meanwhile, if the logic circuits 314 and 315 are irrelevant to the verification, they should be set to black box status during the simulation. The unnecessary logic circuits can be extracted by designating blocks directly or by deeming circuits that cannot be extracted by back tracing from the external terminal for BIST as unnecessary.

Although the BIST circuit 312 and memory 313 can be simulated using entirely full delay, the system is also configured such that it can switch to simulation without delay at RTL (where execution times are shorter) for operations that are known to be less constrained in terms of timing. The switch can be made, for example, by arranging for the circuit analysis unit 107 of FIG. 1 to be designated an address range of the memories for which full delay simulation will be conducted.

The circuit analysis processing executed with respect to the BIST design will now be described. In memory BIST design, the DFT information includes information regarding external output terminals for memory BIST use, memory and BIST blocks, and input terminal setting information. The input to the memory blocks targeted for testing is information regarding the input terminal used during execution of the BIST.

The circuit analysis unit 107 extracts memory BIST circuits and memory blocks. First, a test mode signal that is fixed during BIST is set and signals whose values become fixed are confirmed. The circuitry from an external output to the BIST circuit is extracted. Then, the circuit is traced from the input terminal of the BIST block toward the input direction and extracted portions are deemed to be portions targeted for memory BIST. During tracing, when a device other than a memory block is met, the trace is continued from the input terminal of the device if it is determined that the device is transparent with respect to a single input (this is the same as is done when tracing a scan circuit). When the output terminal of a memory block is reached, the trace is performed with respect to each input terminal thereof; however, terminals that are not cataloged as terminals used during BIST are not targeted for tracing. The trace is ended when the original BIST circuit is reached or when an external terminal is reached.

The circuit portions extracted during the extraction processing are deemed to be targeted for the memory BIST simulation. All other portions are handled as black boxes and are not operated during the simulation. Depending on the conditions during the simulation, the BIST blocks are sometimes set in such a manner as to change the simulation level.

Figure 6:
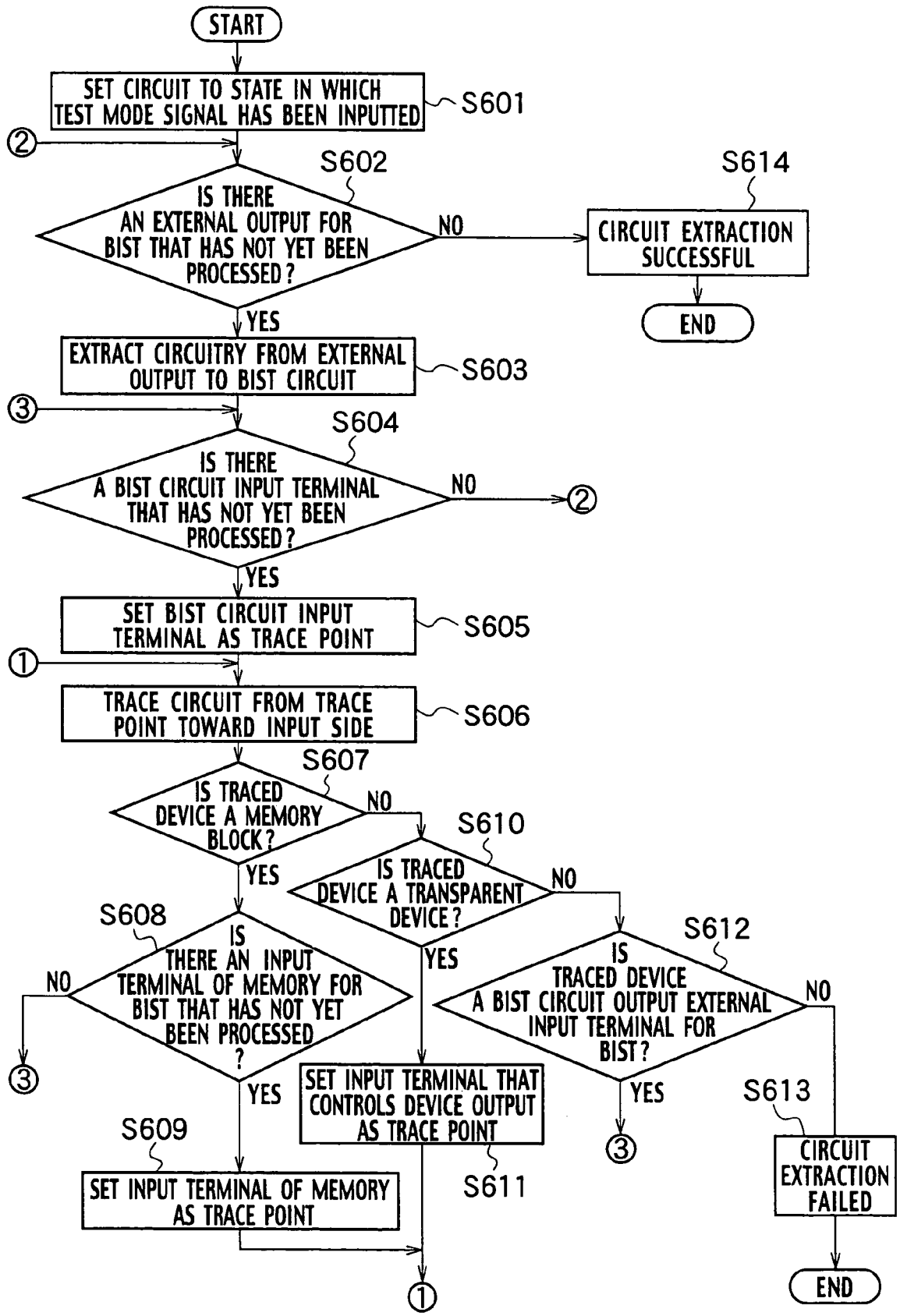
FIG. 6 is a flowchart showing an example of the circuit analysis processing executed with respect to the memory BIST design.

FIG. 6 is a flowchart showing an example of the circuit analysis processing executed with respect to the memory BIST design. First, the circuit is set to a state in which the test mode signal has been inputted (step S601). Next, it is determined if there is an external output for BIST that has not yet been processed (step S602). If there is an external output for BIST that has not yet been processed, the circuitry from the external output to the BIST circuit is extracted (step S603). Then, a determination is made as to whether there is an input terminal of the BIST circuit that has not yet been processed (step S604). If there is an input terminal of the BIST circuit that has not yet been processed, the input terminal of the BIST circuit is set as a trace point (step S605). Next, the circuit is traced from the set trace point toward the input side (step S606) and it is determined if the traced device is a memory block (step S607). If the traced device is a memory block, a determination is made as to whether the memory block has an input terminal for BIST circuit that has not yet been processed (step S608). If the memory block has an input terminal for BIST circuit that has not yet been processed, the input terminal of the memory for BIST circuit is set as a trace point (step S609) and the analysis processing proceeds to step S606. If it is determined in step S608 that the memory block does not have an input terminal for BIST circuit that has not yet been processed, the analysis processing proceeds to step S604.

Meanwhile, if the traced device is determined not to be a memory block in step S607, a determination is made as to whether the device is a transparent terminal (step S610). If the device is determined to be a transparent terminal, the input terminal that controls the device output is set as a trace point (step S611) and the analysis processing proceeds to step S606. If it is determined in step S610 that the device is not transparent, a determination is made as to whether the traced device is a BIST circuit output or an external input terminal for BIST circuit (step S612). If the device is determined to be either of these terminals, the analysis processing proceeds to step S604. Conversely, if the device is determined to be neither of said terminals in step S612, the circuit extraction is deemed a failure (step S613) and the processing ends. Thus, the circuitry from every external output to the BIST circuit is extracted and, when every external output for BIST has been processed, the circuit extraction is deemed a success (step S614) and the processing is ended.

In this way, the circuits involved in the verification can be extracted by conducting a circuit analysis with respect to the memory BIST design. As a result, the speed of the simulation for verification of the semiconductor integrated circuit can be increased by setting all other portions to black box status.

Third Embodiment

As mentioned previously, the verification simulation conducted with respect to the logic BIST circuit is basically the same as the parallel load simulation conducted with respect to the scan design, but it incurs such drawbacks as the involvement of extra tasks and the absence of simulation of some important circuit portions. In the verification simulation performed by this embodiment with respect to the logic BIST circuit, the pattern generator and the pattern compressor are simulated at full delay (in the same manner as the scan path) during the shift operation, and the logic circuit are simulated at full delay only during capture of the output. As a result, the simulation time can be dramatically reduced while conducting a sufficient simulation of the necessary circuit portions. The switch is accomplished using the scan shift enable signal but, similarly to scan design, it is necessary to switch the logic circuit portions to the full delay model at a point in time one cycle previous to the signal change.

The circuit analysis processing executed with respect to a logic BIST design like that shown in FIG. 13 will now be described. In the case of the logic BIST design, information regarding the external output terminals for logic BIST, the logic BIST blocks, and the functions of the input and output pins of the logic BIST blocks is inputted as DFT information. Said pin functions include scan chain input, scan chain output, scan shift enable output, BIST output, BIST clock, BIST enable signal, and input terminal setting information.

The circuit analysis unit 107 extracts logic BIST circuits and scan chains. First, the circuit analysis unit 107 sets a test mode signal that becomes fixed during execution of BIST and confirms signals whose values become fixed. The circuit analysis unit 107 first extracts the circuits between the external output and the BIST circuit. Then it establishes the scan chain input of the BIST circuit as a starting point and the scan chain output as an end point and, similarly to the scan circuit extraction processing, extracts scan chains. The circuit analysis unit 107 also traces from the other BIST circuit input terminals toward the input side. When a device is reached during the tracing, similarly to the tracing of the scan circuit, the trace is continued from the input terminal of the device if it is determined that the device is transparent with respect to a single input. The trace is ended when the original BIST circuit is reached or when the external terminal is reached.

The circuit analysis unit 107 also analyzes the test pattern descriptions and extracts the point in time when the scan enable output of the BIST circuit goes to the disable state. The cycles during which the scan disable state exists and the cycle preceding the cycle when the disable state first occurred are deemed to be the period during which simulation of the entire circuit is required and, during this period, simulations at the required level are performed with respect to all portions of the circuit. All other cycles are considered to be scan shift cycles. During these other cycles, simulations at the required level are performed only with respect to circuits that are required for the scan shift operation, which includes the logic BIST blocks. The other portions are handled as black boxes and are not operated.

Figure 14:
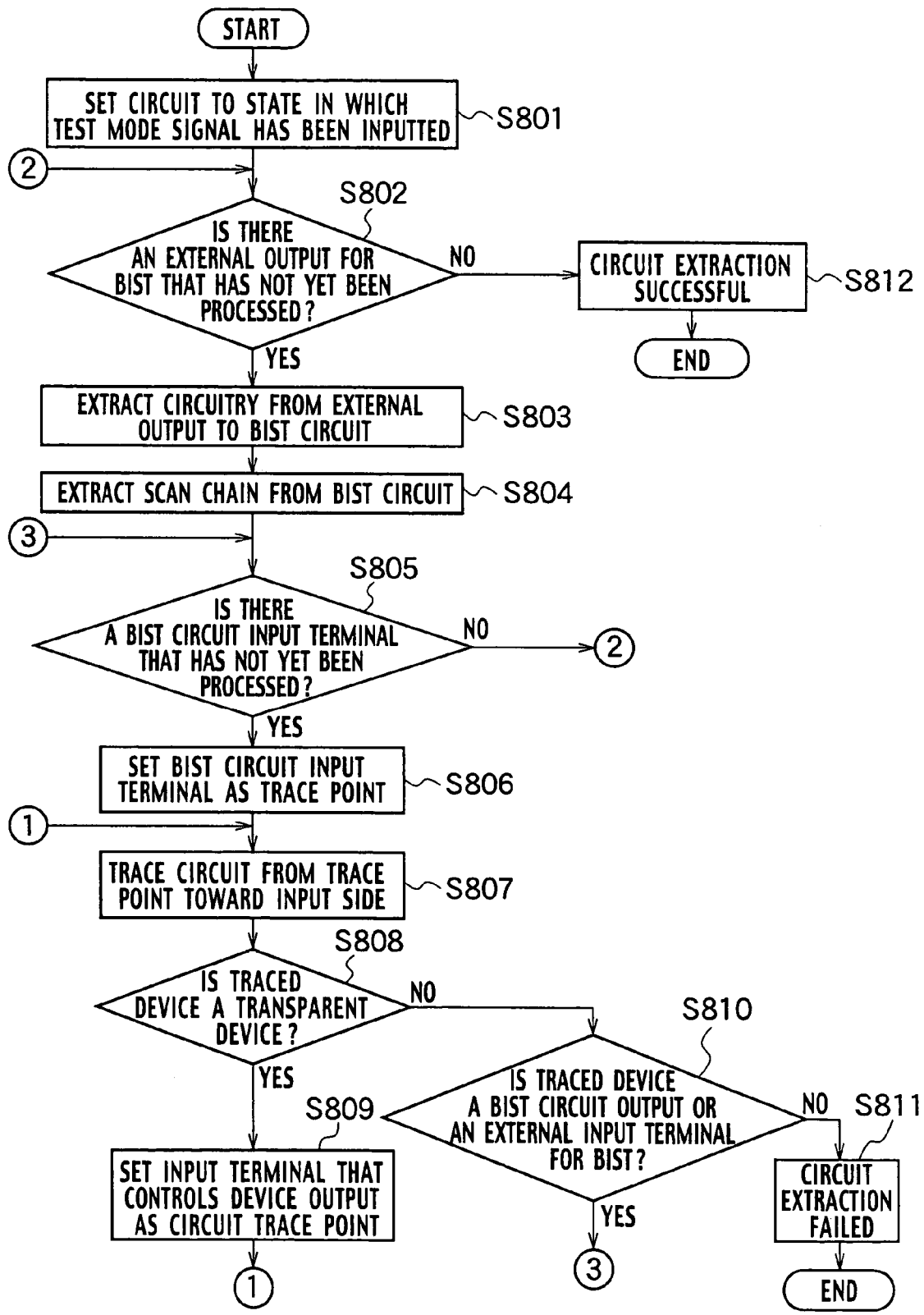
FIG. 14 is a flowchart of the circuit analysis processing executed with respect to the logic BIST design.

FIG. 14 is a flowchart of the circuit analysis processing executed with respect to the logic BIST design. First, the circuit is set to a state in which the test mode signal has been inputted (step S801). Next, it is determined if there is an external output for BIST that has not yet been processed (step S802). If there is an external output for BIST that has not yet been processed, the circuitry from the external output to the BIST circuit is extracted (step S803). Then, the scan chain is extracted from the BIST circuit (step S804). Then, a determination is made as to whether there is an input terminal of the BIST circuit that has not yet been processed (step S805). If there is not an input terminal of the BIST circuit that has not yet been processed, analysis processing proceeds to step S802. If there is an input terminal of the BIST circuit that has not yet been processed, the input terminal of the BIST circuit is set as a trace point (step S806) and the circuit is traced from the trace point toward the input side (step S807). If the result of the trace indicates that the traced device is transparent (step S808), the input terminal that controls the device output is set as a trace point (step S809). Meanwhile, if the traced device is not transparent, a determination is made as to whether the device is a BIST circuit output or an external input terminal for BIST (step S810). If the device is determined to be either of these devices, the analysis processing proceeds to step S805. Conversely, if the device is determined to be neither of said devices, the circuit extraction is deemed a failure (step S811) and the processing ends. Thus, when every external output for BIST has been circuit-analyzed, the circuit extraction is deemed a success (step S812) and the processing is ended.

In this way, the circuits involved in the verification can be extracted by conducting a circuit analysis with respect to the logic BIST design. As a result, the speed of the simulation for verification of the semiconductor integrated circuit can be increased by setting all other portions to black box status during scan shift.

Fourth Embodiment

Figure 7:
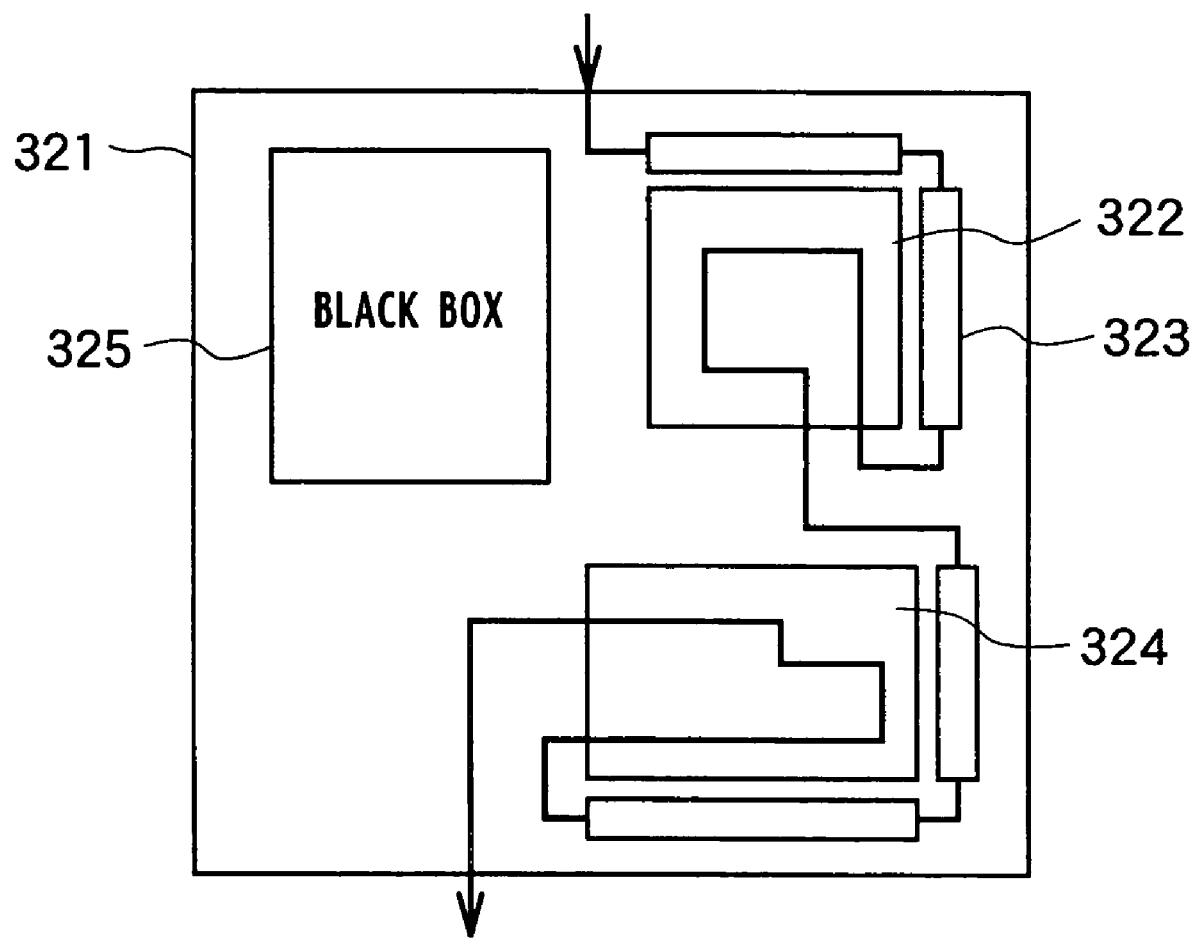
FIG. 7 is a block diagram for explaining the core test verification simulation of an IP core base system LSI.

FIG. 7 is a block diagram for explaining the core test verification simulation of an IP core base system LSI. The test of each core is conducted using a scan path connected to the periphery of the core and an internal scan path in some cases. Similarly to the scan design, the inside of the core targeted for testing can be verified by switching between the shift and capture levels. Since a scan path at the boundary of the core is necessary for setting the input and output of the core targeted for testing, simulation at full delay is only required for the shift operation. As shown in FIG. 7, the inside of the core base system LSI 321 has a core 322 targeted for testing, a core boundary 323, a core 324 that is not targeted for testing but passed though by a scan path, and a core 325 that is not targeted for testing. Although the core 324 is not targeted for testing, when the shift operation is necessary for the serial input and output of data to and from the core 322 targeted for testing, the paths that pass through core 324 are simulated at full delay only during shifting. Since it is not necessary to simulate the internal logic of the core 324, it is suitable to treat the internal logic of the core 324 as a black box throughout the testing. The core 325, which is not targeted for testing, is not related to this simulation and, thus, all internal portions thereof can be treated as a black box throughout the testing.

In this way, by switching the level of abstraction of the blocks during the execution of the simulation, unnecessary simulation time can be reduced and the overall simulation time can be greatly reduced. This embodiment also provides the effect of eliminating the need to specially prepare the circuit descriptions and test patterns for the simulation.

The circuit analysis processing executed with respect to the core test design will now be described. In the case of the core test design, the DFT information input includes groups of function blocks that will be tested simultaneously, the test mode signal setting in analysis, and scan in, scan out, and scan enable terminals.

The circuit analysis unit 107 extracts scan chains during each test mode in the same manner as in the scan design analysis. During each test mode, the circuit analysis unit 107 extracts scan chains that pass through the function block to be tested or have a register connected to the input and output terminals of the function block. Similarly to the scan chains in the case of the scan design, these scan chains are always simulated at the required level during current test mode because the shift operation is executed during this test mode. Also, similarly to the logic circuit portions in the case of the scan design, during each test mode all portions of the function block to be tested other than the scan chain and related portions are treated as black boxes during the shift operation.

Function blocks other than above but which are passed through by said scan chains only need to be simulated during the shift operation and, thus, all portions thereof other than the scan chains and related circuitry are treated as black boxes throughout the duration of this test mode. Function blocks that do not match either of the previous descriptions are irrelevant to the test during the test mode and all internal portions thereof are treated as black boxes throughout the test mode.

Figure 8:
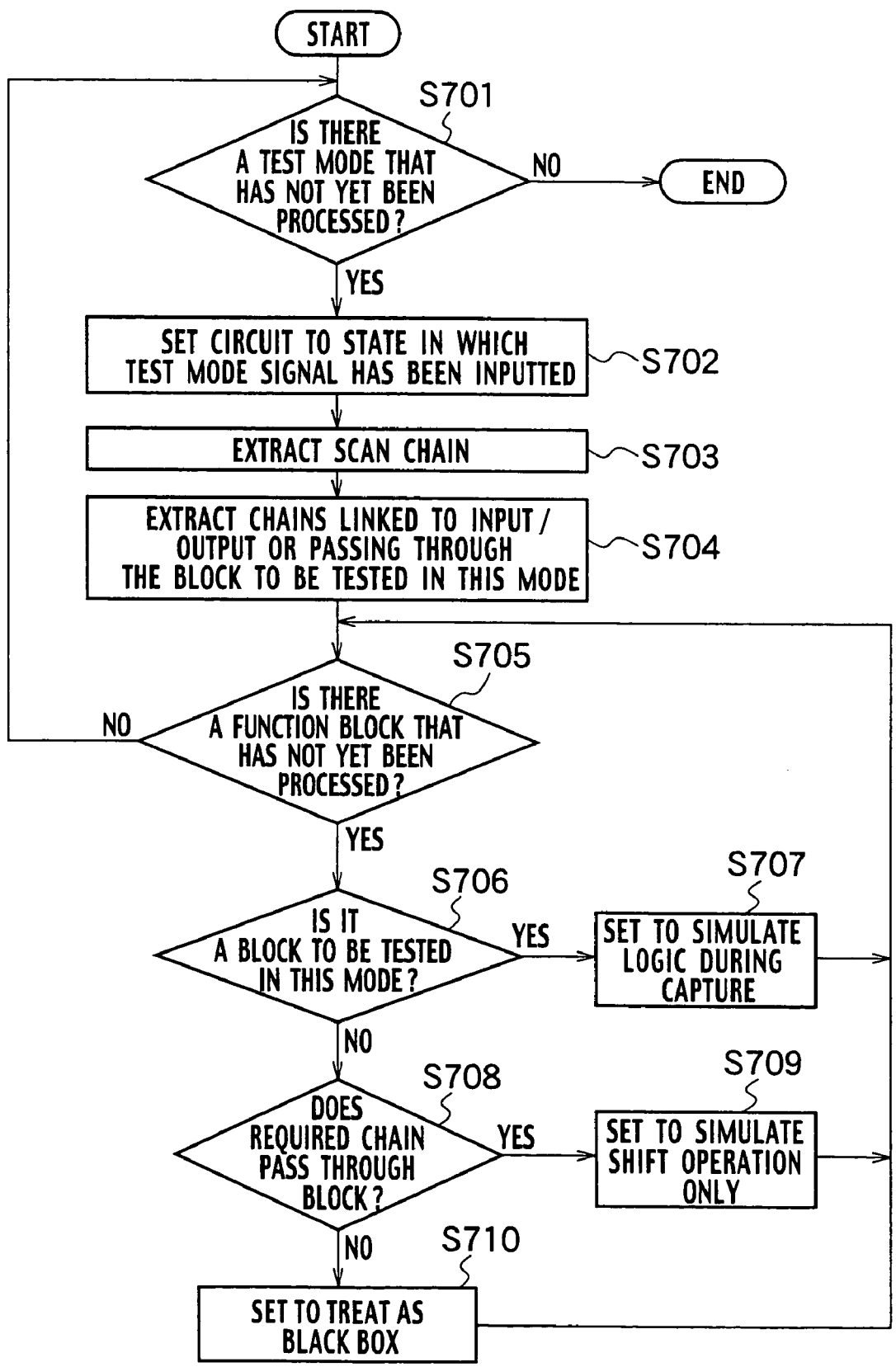
FIG. 8 is a flowchart showing the circuit analysis processing executed with respect to core test design.

FIG. 8 is a flowchart showing the circuit analysis processing executed with respect to core test design. First, a determination is made as to whether there is a test mode that has not yet been processed (step S701). If there is a test mode that has not yet been processed, the circuit is set to a state in which the test mode signal has been inputted (step S702). Next, a scan chain is extracted (step S703) and a scan chain that passes through the block to be tested in this mode or is linked to the input and output of the block is extracted (step S704). Then a determination is made as to whether there is a function block that has not yet been processed (step S705). If there is a function block that has not yet been processed, a determination is made as to whether the function block is to be tested in this test mode (step S706). If it is a block to be tested in this mode, a setting is made to simulate the logic during capturing (step S707) and the analysis processing proceeds to step S705. Meanwhile, if it is not a block to be tested in this mode, a determination is made as to whether a required chain passes through the block (step S708). If a required chain passes through the block, a setting is made to simulate the block during the shift operation only (step S709) and the analysis processing proceeds to step S705. If a required chain does not pass through the block, a setting is made to treat the block as a black box and the analysis processing proceeds to step S705 (step S710).

In this way, the circuits required for a core test verification simulation of an IP core base system LSI can be extracted by conducting a circuit analysis with respect to the core test verification simulation. As a result, the speed of the simulation for verification of the semiconductor integrated circuit can be increased by setting all other portions to black box status.

By switching the level of abstraction of the blocks during execution of the simulation, a semiconductor integrated circuit verification system according to this embodiment can reduce unnecessary simulation time and greatly reduce the overall simulation time. This embodiment also enables the simulation to be simplified because it is not necessary to specially prepare the circuit descriptions and test patterns for the simulation.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. A semiconductor integrated circuit verification system comprising:
   a DFT information input unit configured to receive DFT information, which is scan circuit information for a scan designed semiconductor integrated circuit;
   a circuit extraction unit configured to analyze the circuitry inside the semiconductor integrated circuit and extract the circuits related to the verification; and
   a simulation control unit configured to generate a simulation object for conducting a simulation while changing an abstraction level of the extracted circuits;
   wherein, before generating a simulation object for conducting a simulation, the simulation control unit detects a point in time when an operating state changes from a scan shift cycle to a capture cycle and rewinds at least one cycle from the detected point in time.

2. A semiconductor integrated circuit verification system comprising:
   a DFT information input unit configured to receive DFT information which is scan circuit information for a scan designed semiconductor integrated circuit;
   a circuit extraction unit configured to analyze the circuitry inside the semiconductor integrated circuit and extract the circuits related to the verification; and
   a simulation control unit configured to generate a simulation object for conducting a simulation while changing an abstraction level of the extracted circuits;
   wherein the circuit extraction unit traces the circuitry from each scan out terminal set inside the semiconductor integrated circuit toward the input side in such a manner that when it reaches a scan out terminal of a scan register, the circuit extraction unit catalogs the register and continues tracing from the scan 5 input terminal of the register and when it reaches a scan input of a circuit, the circuit extraction unit extracts the circuit;
   wherein the circuit extraction unit extracts circuits in the following fashion:
   the circuit extraction unit traces the circuitry in the direction of the input from the clock input of the scan register and extracts backward a clock tree structure up to the clock signal input;
   if it reaches a device other than the scan register during the scan circuit extraction processing, the circuit extraction unit determines whether it is possible to execute the trace based on the type and state of the device;
   if it reaches the output of a buffer or inverter, the circuit extraction unit treats the buffer or inverter as a transparent device and resumes the trace from the input thereof;
   if it reaches the output of a functional device other than a buffer or inverter and the output of the device can be controlled either directly or in an inverted state based on a single input by looking at the input state of the device, the circuit extraction unit performs a scan chain trace from the input terminal of the device; and
   if the scan chain trace is successful, the register, buffer, inverter and other devices passed through during the extraction as well as the scan in, scan out, and scan enable terminals are cataloged collectively by the circuit extraction unit as a circuit required for the scan shift operation;
   wherein the simulation control unit deems the cycles during which the a scan disable state exists and the cycle preceding the cycle when the disable state first occurred to be the period during which simulation of the entire circuit is required.

3. A semiconductor integrated circuit verification system comprising:
   a DFT information input unit configured to receive DFT information which is scan circuit information for a scan designed semiconductor integrated circuit;
   a circuit extraction unit configured to analyze the circuitry inside the semiconductor integrated circuit and extract the circuits related to the verification; and
   a simulation control unit configured to generate a simulation object for conducting a simulation while changing an abstraction level of the extracted circuits;
   wherein during verification of the logic BIST design, the simulation control unit performs the following:
   analyzes test pattern descriptions and extracts a point in time when a scan enable output of the BIST circuit goes to a disable state;
   deems the cycles during which the scan disable state exists and the cycle preceding the cycle when the disable state first occurred to be the period during which simulation of the entire circuit is required and, during this period, performs simulations at the required level with respect to all portions of the circuit;
   deems all other cycles to be scan shift cycles and, during these other cycles, sets only those circuits that are required for the scan shift operation, which includes the extracted logic BIST blocks, to simulation at the required level; and
   sets all other portions to the black box level.

4. A semiconductor integrated circuit verification system comprising:

a DFT information input unit configured to receive DFT information which is scan circuit information for a scan designed semiconductor integrated circuit;

a circuit extraction unit configured to analyze the circuitry inside the semiconductor integrated circuit and extract the circuits related to the verification; and a simulation control unit configured to generate a simulation object for conducting a simulation while changing an abstraction level of the extracted circuits;

wherein, during a core test verification of an IP core base system LSI design, the simulation control unit verifies the cores targeted for verification while switching the level between shift and capture, simulates scan paths at the boundary of the cores targeted for verification at full delay only during the shift operation, and sets cores not targeted for verification to the black box level; and wherein, the circuit extraction unit extract a scan chain during each test mode in such a manner that it extracts a scan chain that passes through a function block that is to be tested in the current test mode 5 or a scan chain that has a register connected to input and output terminals of the function block.

5. The system of claim 1, wherein, based on the DFT information, the circuit extraction unit extracts circuit portions that are not necessary for the simulation and sets said circuit portions to a black box level.

6. The system of claim 1, wherein the simulation control unit executes equivalence checking processing to determine whether or not functions of blocks targeted for switching are different.

7. The system of claim 1, wherein, during scan path shifting, the simulation control unit only sets a scan path operation to simulation at full delay and sets a combinational circuit to a black box level.

8. The system of claim 1, wherein, when a memory BIST circuit is verified, the simulation control unit sets BIST circuits and memories in the memory BIST circuit to full delay simulation and sets other circuits that are irrelevant to verification to a black box level.

9. The system of claim 1, wherein during verification of BIST design logic, the circuit extraction unit:

sets a test mode signal that becomes fixed during BIST execution and confirms signals whose values become fixed;

extracts the circuitry from an external output to a BIST circuit;

establishes a scan chain input of the BIST circuit as a starting point and a scan chain output as an end point and extracts scan chains;

performs a trace from another BIST circuit input terminal toward the input side;

when a device is reached during tracing, continues the trace from the input terminal if the circuit extraction unit determines that a device associated with the input terminal is transparent with respect to a single input; and ends the trace when the BIST circuit or an external terminal is reached.

10. The system of claim 2, wherein, based on the DFT information, the circuit extraction unit extracts circuit portions that are not necessary for the simulation and sets said circuit portions to a black box level.

11. The system of claim 2, wherein the simulation control unit executes equivalence checking processing to determine whether or not functions of blocks targeted for switching are different.

12. The system of claim 2, wherein, during scan path shifting, the simulation control unit only sets a scan path operation to simulation at full delay and sets a combinational circuit to a black box level.

13. The system of claim 3, wherein, based on the DFT information, the circuit extraction unit extracts circuit portions that are not necessary for the simulation and sets said circuit portions to a black box level.

14. The system of claim 3, wherein the simulation control unit executes equivalence checking processing to determine whether or not functions of blocks targeted for switching are different.

15. The system of claim 3, wherein, during scan path shifting, the simulation control unit only sets a scan path operation to simulation at full delay and sets a combinational circuit to a black box level.

16. The system of claim 3, wherein during verification of BIST design logic, the circuit extraction unit:

sets a test mode signal that becomes fixed during BIST execution and confirms signals whose values become fixed;

extracts the circuitry from an external output to a BIST circuit;

establishes a scan chain input of the BIST circuit as a starting point and a scan chain output as an end point and extracts scan chains;

performs a trace from another BIST circuit input terminal toward the input side;

when a device is reached during tracing, continues the trace from the input terminal if the circuit extraction unit determines that a device associated with the input terminal is transparent with respect to a single input; and ends the trace when the BIST circuit or an external terminal is reached.

17. The system of claim 4, wherein, based on the DFT information, the circuit extraction unit extracts circuit portions that are not necessary for the simulation and sets said circuit portions to a black box level.

18. The system of claim 4, wherein the simulation control unit executes equivalence checking processing to determine whether or not functions of blocks targeted for switching are different.

19. The system of claim 4, wherein, during scan path shifting, the simulation control unit only sets a scan path operation to simulation at full delay and sets a combinational circuit to a black box level.

* * * * *